US011725985B2

(12) United States Patent
Bullock

(10) Patent No.: US 11,725,985 B2
(45) Date of Patent: Aug. 15, 2023

(54) SIGNAL CONVERSION SYSTEM FOR OPTICAL SENSORS

(71) Applicant: Verity Instruments, Inc., Carrollton, TX (US)

(72) Inventor: Larry Arlos Bullock, Carrollton, TX (US)

(73) Assignee: Verity Instruments, Inc., Carrollton, TX (US)

( * ) Notice: Subject to any disclaimer, the term of this patent is extended or adjusted under 35 U.S.C. 154(b) by 899 days.

(21) Appl. No.: 16/400,960

(22) Filed: May 1, 2019

(65) Prior Publication Data

US 2019/0339130 A1 Nov. 7, 2019

Related U.S. Application Data

(60) Provisional application No. 62/666,433, filed on May 3, 2018.

(51) Int. Cl.
*G01J 3/28* (2006.01)
*H03M 1/12* (2006.01)
*G01J 3/02* (2006.01)

(52) U.S. Cl.
CPC .............. *G01J 3/28* (2013.01); *G01J 3/0232* (2013.01); *H03M 1/12* (2013.01)

(58) Field of Classification Search
CPC ...... G01J 3/28; G01J 3/0232; G01J 2001/444; G01J 1/0252; G01J 1/44; G01J 3/02; G01J 3/0286; G01J 3/027; H03M 1/12; H04N 5/22521; H04N 5/357
See application file for complete search history.

(56) References Cited

U.S. PATENT DOCUMENTS

| 3,886,331 A | 5/1975 | Schierer, Jr. |
| 4,744,657 A | 5/1988 | Aralis et al. |
| 5,457,530 A * | 10/1995 | Nagai ...................... G01J 3/06 356/330 |
| 6,259,936 B1 * | 7/2001 | Boggett ............... A61B 5/0261 600/475 |
| 7,961,314 B2 | 6/2011 | Lundquist et al. |
| 2003/0098290 A1 | 5/2003 | Kaji et al. |
| 2004/0181148 A1 * | 9/2004 | Uchiyama ................ A61B 1/07 600/173 |

(Continued)

FOREIGN PATENT DOCUMENTS

| CN | 101997667 A | 3/2011 |
| CN | 103858436 A | 6/2014 |

(Continued)

*Primary Examiner* — John R Lee

(57) ABSTRACT

The disclosure provides an optical instrument, a method of converting an optical input to a digital signal output, and a spectrometer. In one embodiment, the optical instrument includes: (1) an optical sensor configured to receive an optical input and convert the optical input to electrical signals, and (2) a conversion system having conversion circuitry having multiple parallel signal channels that are configured to receive and modify the electrical signals to analog outputs, an analog switch configured to select one of the parallel signal channels according to an operating mode of the optical instrument, and an analog to digital converter configured to receive and convert the analog output from the selected parallel signal channel to a digital signal output.

29 Claims, 5 Drawing Sheets

(56) References Cited

U.S. PATENT DOCUMENTS

| | | | | |
|---|---|---|---|---|
| 2006/0128009 A1* | 6/2006 | Cerrone | ............... | G01N 21/645 |
| | | | | 435/303.1 |
| 2006/0192959 A1* | 8/2006 | Manolopoulos | ....... | G01N 21/19 |
| | | | | 356/364 |
| 2011/0092842 A1* | 4/2011 | Decaria | ................ | A61B 5/4041 |
| | | | | 600/544 |
| 2012/0261553 A1* | 10/2012 | Elkind | ................. | H04N 5/3745 |
| | | | | 250/208.1 |
| 2014/0266119 A1 | 9/2014 | Burton et al. | | |
| 2015/0011027 A1* | 1/2015 | Lian | ................. | H01L 21/31133 |
| | | | | 438/16 |

FOREIGN PATENT DOCUMENTS

| | | | |
|---|---|---|---|
| CN | 204101182 U | | 1/2015 |
| CN | 104954760 A | | 9/2015 |
| CN | 106233644 A | | 12/2016 |
| CN | 106813735 A | | 6/2017 |
| EP | 0653626 A1 | | 5/1995 |
| JP | H05264610 A | | 10/1993 |
| JP | H07190946 A | | 7/1995 |
| JP | H08111812 A | | 4/1996 |
| JP | H10145683 A | | 5/1998 |
| JP | 2001007660 A | | 1/2001 |
| JP | 2001144555 A | | 5/2001 |
| JP | 2006115324 A | * | 4/2006 |
| JP | 2006115324 A | | 4/2006 |
| JP | 2014022857 A | | 2/2014 |
| JP | 2017092998 A | | 5/2017 |
| TW | I595228 B | | 8/2017 |

\* cited by examiner

SIGNAL CONVERSION SYSTEM FOR OPTICAL SENSORS

CROSS-REFERENCE TO RELATED APPLICATION

This application claims the benefit of U.S. Provisional Application Ser. No. 62/666,433, filed by Larry Arlos Bullock on May 3, 2018, entitled "SIGNAL CONVERSION SYSTEM FOR OPTICAL SENSORS," commonly assigned with this application and incorporated herein by reference in its entirety.

TECHNICAL FIELD

The disclosure relates, generally, to optical spectroscopy systems and, more particularly, to improving the dynamic range and noise performance of analog-to-digital signal conversion systems for spectrometers and optical sensors used therein.

BACKGROUND

Optical monitoring of semiconductor processes is a well-established method for process control. The constant advance of semiconductor manufacturing toward faster processes, smaller feature sizes and more complex structures places great demands on optical monitoring technologies. For example, higher data sampling rates (e.g., optical signal measurements or spectra collected per second) are required to accurately monitor much faster etch rates on very thin layers where changes in a few atomic layers are critical. Greater signal-to-noise ratio is also required in many cases to support detection of very small changes in optical signals. All of these requirements seek to drive advancements in the performance of optical monitoring systems for semiconductor processes. Within a spectrometer, an optical sensor, often an areal charge-coupled-device ("CCD") or linear single row device, and its associated conversion circuitry are critical elements for determining data sampling rates, optical/electrical bandwidth, optical/electrical signal detection sensitivity, optical/electrical signal-to-noise ratio performance, etc.

SUMMARY

In one aspect, the disclosure provides an optical instrument. In one embodiment, the optical instrument includes: (1) an optical sensor configured to receive an optical input and convert the optical input to electrical signals, and (2) a conversion system having conversion circuitry having multiple parallel signal channels that are configured to receive and modify the electrical signals to analog outputs, an analog switch configured to select one of the parallel signal channels according to an operating mode of the optical instrument, and an analog to digital converter configured to receive and convert the analog output from the selected parallel signal channel to a digital signal output.

In another aspect, the disclosure provides a method of converting an optical input to a digital signal output. In one embodiment, the method includes: (1) receiving an operating mode, (2) receiving electrical signals from an optical sensor representing an optical input to the optical sensor, (3) selecting one of at least two parallel signal channels based on the operating mode for modifying the electrical signals, and (4) converting the modified electrical signals to a digital signal output.

In yet another aspect, the disclosure provides a spectrometer. In one embodiment, the spectrometer includes: (1) a controller configured to direct operation of the spectrometer based on an operating mode, (2) an optical sensor configured to receive an optical input and provide electrical signals based on the optical input and the operating mode, and (3) a conversion system that modifies the electrical signals along parallel signal channels and selects one of the modified electrical signals as a digital signal output based on the operating mode.

BRIEF DESCRIPTION OF THE DRAWINGS

The features characteristic of the disclosure believed to be novel are set forth in the appended claims. The disclosure itself, however, as well as a mode of use, further objectives and advantages thereof, will be best understood by reference to the following detailed description of an illustrative embodiment when read in conjunction with the accompanying drawings wherein:

DETAILED DESCRIPTION

Figure 1A:
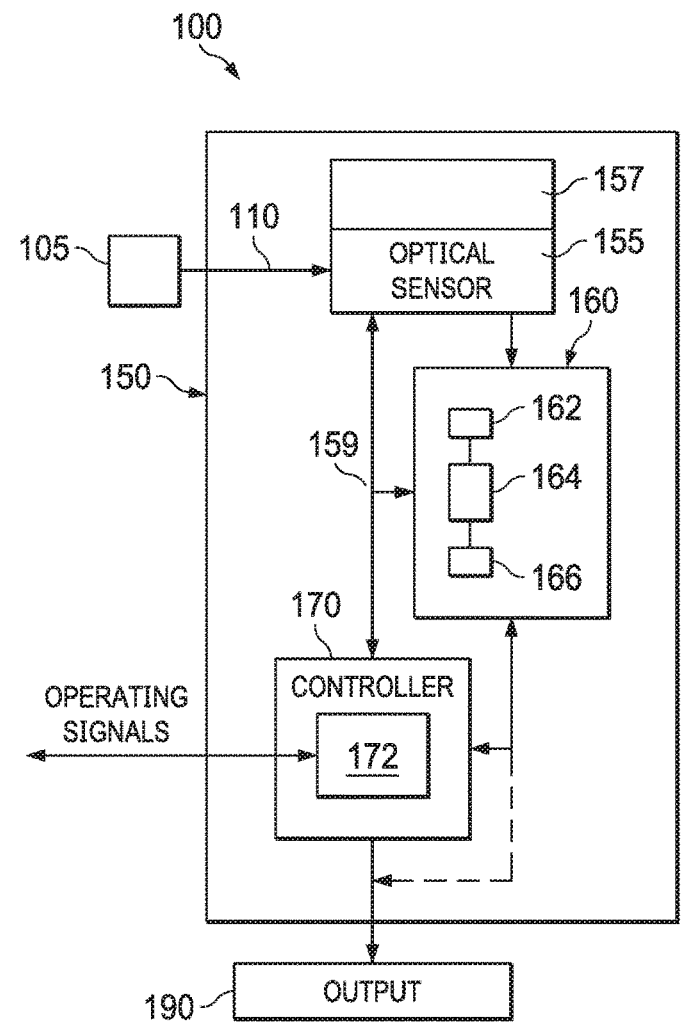
FIG. 1A is a block diagram of an optical system including an optical instrument having a conversion system for an optical sensor, in accordance with the principles of the disclosure.

In the following description, reference is made to the accompanying drawings that form a part hereof, and in which is shown by way of illustration, specific embodiments in which the features of the disclosure may be practiced. These embodiments are described in sufficient detail to enable those skilled in the art to practice the features of the disclosure, and it is to be understood that other embodiments may be utilized. It is also to be understood that structural, procedural and system changes may be made without departing from the spirit and scope of the disclosure. The following description is, therefore, not to be taken in a limiting sense. For clarity of exposition, like features shown in the accompanying drawings are indicated with like reference numerals and similar features as shown in alternate embodiments in the drawings are indicated with similar reference numerals. Other features of the disclosure will be apparent from the accompanying drawings and from the following detailed description. It is noted that, for purposes of illustrative clarity, certain elements in the drawings may not be drawn to scale.

As noted above, improved sampling and improved signal-to-noise ratio are important to accurately monitor much faster etch rates on very thin layers where changes in a few atomic layers are critical, and to support detection of very small changes in optical signals. These considerations, in addition to timing, are important to processing the electrical signals provided by the optical sensors. In addition, proper operation of the optical sensor itself is important to ensure that the electrical signals accurately reflect the received optical data. All of these requirements seek to drive advancements in the performance of optical monitoring systems for semiconductor processes.

For example, an optical sensor can add additional noise to the electrical signals when an optical sensor operates outside of its temperature range. As the noise increases, the signal to noise ratio decreases and the data present within the electrical signals may be compromised. This is even more critical when processing data over a wide dynamic range. In some instances, thermal fluctuations of the optical sensor can create a modulation in the background noise of the signal that even resembles a monitored semiconductor process signal from the optical source. As such, regardless of the processing precision of the spectrometer including the optical sensor, the electrical signals being processed can be compromised. Accordingly, the optical monitoring can provide false results.

In addition to ensuring the optical sensor is operating properly, the timing used for the processing is also important; this is especially true when the optical source employs a modulated or pulsed plasma. In these applications, the modulation of a modulated or pulsed plasma should be in synch with the processing of the electrical signals in order to discriminate between what is a normal modulation cycle and what is something that is abnormal. Synchronization also limits the adverse impact of aliasing and other time-slewing concerns.

Accordingly, the disclosure improves the operation of a spectrometer to ensure the data processed by the spectrometer is of high quality that accurately reflects a process being optically monitored. As such, the disclosure provides enhanced feedback to additional systems such as a user, a controlling computer, or a semiconductor processing tool by monitoring critical parameters around operation of an optical sensor to inform of anything abnormal or trending that can lead to corrupt data. Additionally, the disclosure provides an operating mode that employs hardware synching between the modulation of a plasma of an optical signal source with the spectrometer processing.

Regarding the operation of the optical sensor, the disclosure provides thermal monitoring that determines when a cooling system for an optical sensor is approaching operational limits. A warning can then be delivered that indicates the thermal environment of the optical sensor is such that the data can be corrupted. For example, the optical sensor may be operating too warmly or its operating temperature may be unstable. The warning can be included as feedback within a data stream provided by the spectrometer to indicate data may be compromised or may soon be compromised. As such, an operator, controller, or other interacting system of the optical monitoring system can be made aware of potential negative conditions of the cooling system and data degradation.

Regarding hardware synching, the disclosure provides an example wherein the operation of an optical sensor to generate electrical signals from optical signals and the processing of the electrical signals are synched with the modulation used to generate the optical signals. Thus, the disclosure provides a controlled system that employs timing based on an external synch signal. A synch mode can be selected to employ the external synch signal and adjust operation of a spectrometer and optical sensor accordingly.

In one example, a spectrometer controller receives a low latency digital external synch signal that is in phase locked with the plasma modulation drive for synching. The spectrometer controller can be implemented as field programmable integrated circuit (FPGA) or can include a FPGA to receive the digital signal and further act upon the signal.

Turning now to the Figures, FIG. 1A illustrates a block diagram of an optical system 100 with an optical signal source 105 providing light to optical instrument 150 to produce system output 190. Optical instrument 150 includes, at least, optical sensor 155, conversion system 160, and controller 170. The optical system 100 can be used with semiconductor wafer processing equipment. As such, the optical signal source 105 can be a processing chamber and the optical instrument 150 can be a spectrometer that is used to, for example, monitor and/or control the state of a plasma or non-plasma process within a process tool. In some embodiments, the optical instrument 150 can include features from conventional spectrometers, such as a SD1024G model spectrometer manufactured by Verity Instruments, Inc. of Carrollton, Tex. The optical system 100 can also be used with other types of optical signal sources and optical instruments that are used for processing an optical input to, for example, monitor or control a process or system. The optical system 100 can be employed with cameras for spatial imaging, interferometers, photometers, polarimetric sensors, general purpose light measurement, etc.

Continuous or discontinuous light from optical signal source 105 may be directed to optical instrument 150 via fiber optic cable 110 or other optical components. In some examples, the light from the optical source 105 is modulated light. Upon reaching optical instrument 150, the light from the optical signal source 105 is received as an optical input for detection and conversion by optical sensor 155.

Optical sensor 155 includes multiple active pixels for converting the light to electrical signals. The electrical signals within optical sensor 155 can be any of electrical charge signals, electrical current signals and/or electrical voltage signals depending upon the exact configuration of optical sensor 155. Commonly, the optical input received over the fiber optic cable is first converted to electrical charge which is then converted to electrical voltage and subsequently made available to devices external to optical sensor 155 via an output amplifier. Optical sensor 155 may be, for example, a CCD such as an areal CCD. In some embodiments the optical sensor 155 can be an S7031 series CCD areal sensor from Hamamatsu of Japan.

Associated with the optical sensor 155 is a cooling system 157 that is configured to keep a temperature of the optical sensor 155 within operating temperature limits and reduce thermal noise that may impact collected signals. The operating temperature limit of optical sensors is typically a parameter established by the manufacturer of an optical sensor. The cooling system 157 also monitors operating parameters of the optical sensor 155 and provides feedback to the controller 170 via connector 159 regarding the operating parameters. In one example, the cooling system 157 includes a thermoelectric cooler (TEC) that is attached to the optical sensor 155. The cooling system 157 can also include fans to assist with cooling the optical sensor 155. In one example, the optical sensor 155 and at least a portion of the cooling system 157 are located together on a single circuit board. FIG. 1B provides an example of a cooling system that can be employed with an optical sensor, such as the optical sensor 155.

Conversion system 160 is configured to receive the electrical signals from the optical sensor 155 at an input interface 162, convert, along a single conversion path 164, the same into digital signals (i.e., a digital output), and provide the digital output at an output interface 166. The converting, modifying, or processing is according to the functions of converting circuit elements of the conversion path 164. Modifying of the electrical signals can include AC/DC referencing, clamping, differential voltage configuring, providing a gain, and providing an offset. The conversion path 164 of the conversion system 160 can include conversion circuitry that includes the converting circuit elements, an analog switch, a differential driver, and an analog to digital converter. The converting circuit elements can be in parallel signal channels. Examples of converting circuit elements are discussed in detail with respect to the conversion system of FIG. 2. The input interface 162 and the output interface 166 can be conventional interfaces configured to communicate signals.

The controller 170 is configured to direct operation of optical sensor 155 and conversion system 160. The controller 170 may be, for example, a FPGA, an embedded processor, or a combination thereof. The controller 170 can send instructions or control signals to the optical sensor 155 and the conversion system 160 via connector 159. The controller 170 can operate in, for example, a continuous independent operating mode or a synched operating mode. In a continuous operating mode, the controller 170 can employ software to determine an internal synch signal. In this operating mode, the light from the optical source 105 may be a continuously emitting light source. In the synch operating mode, the controller 170 receives an external synch signal that is used to control operation of the optical sensor 155 and the conversion system 160. In the synched operating mode, the light received from the optical source 105 is modulated light and the external synch signal corresponds to the modulation that generated the light or other modulation. With the external synch signal, operations of the optical sensor 155 and the conversion system 160 can be phase locked with the external synch signal, such as within nanoseconds of the external synch signal. The controller 170 can use a state machine to direct operation of the optical sensor 155 and the conversion system 160. Depending on the operating mode, the internal or external synch signal is used to drive the state machines. In the synch operating mode, the controller 170 can send a shutter control signal to the optical sensor 155 over connector 159 to open and close the shutter of the optical sensor 155 when operating in synch mode.

The controller 170 can include a communications interface 172 to receive and send operating signals, including operating modes, settings, and control signals. The communications interface 172 can be a conventional interface, such as an interface used to communicate signals on a circuit board. In some embodiments, the operating signals can include the external synch signal that corresponds to the modulating signal used to ignite plasma of the optical signal source 105.

As indicated by the dashed and solid lines in FIG. 1A, the digital output from conversion system 160 may be routed to controller 170 for further processing, storage, etc., and/or may also be directly/indirectly transferred externally as system output 190 for further use by connected systems. In some examples, the controller 170 adds thermal warnings based on cooling parameters from the cooling system 157 as part of the system output 190.

FIG. 1B illustrates a block diagram of an example of a cooling system 120 employed with an optical sensor according to the principles of the disclosure. The cooling system 120 monitors the thermal environment proximate the optical sensor and at other locations within an enclosing system such as a spectrometer to provide an indication of a potential negative condition or conditions for the optical sensor. Cooling parameter data obtained by the cooling system 120 can then be used provide warning of the potential negative conditions and data corruption.

The cooling system 120 may be at least partially implemented on circuit boards, sensor board 121 and cooling board 130. Sensor board 121 includes cooling parameter sensors 122 and a cooler 128 that is thermally coupled to an optical sensor 129. The parameter sensors 122 include a voltage sensor 123, a current sensor 124, a temperature sensor 125 and a control loop sensor 126. The cooling board 130 includes interfaces to fans, 131, 132, and 133, a temperature environment sensor 135, and an interface 137. The cooling system 120 can include additional components that are not illustrated or discussed. For example, the cooling system 120 can include a power supply and circuitry connecting the various components.

The voltage sensor 123, the current sensor 124, and the temperature sensor 125 monitor a voltage, current, and a temperature of the cooler 128. The control loop sensor 126 monitors the operating feedback control loop of the cooler 128. The parameter sensors 122 sense if an operating parameter of the cooler 128 is approaching an operating limit. Accordingly, the parameter sensors 122 can sense if the cooler 128 is operating properly, marginally, or incorrectly. The sensed cooling parameter data from the parameters sensors 122 are transmitted to a controller of an optical instrument via interface 137. The optical instrument can be a spectrometer and the controller can be, for example, the controller 170 of FIG. 1. Accordingly, the interface 137 can communicate with the controller 170 via connector 159.

The cooler 128 is thermally coupled to the optical sensor 129 and is configured to remove heat from the optical sensor 129. The cooler 128 can be a TEC. In addition to sensing for potential cooling problems, the parameter sensors 122 also cooperate with the control loop to maintain operation of the cooler 128.

In addition to the cooler 128, the cooling system 120 also includes fans for cooling the environment of the optical sensor 129. The temperature environment sensor 135 is used to provide a temperature proximate the optical sensor 129. The operating parameters of the fans 131, 132, 133, and the temperature from the temperature environment sensor 135 are also provided to a controller via the interface 137 as part of the cooling parameters. The controller can employ the cooling parameters, individually or collectively, to determine potential problems and data corruption. With the cooling parameters, operators can be better informed of the thermal environment of the optical sensor 129.

Figure 1C:
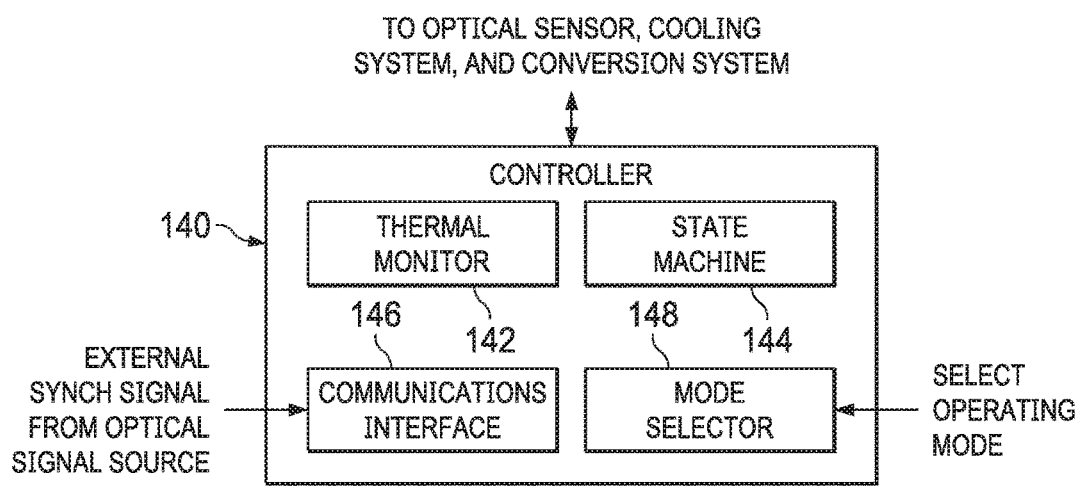
FIG. 1C illustrates a block diagram of an example of a spectrometer controller constructed according to the principles of the disclosure.
Figure 1B:
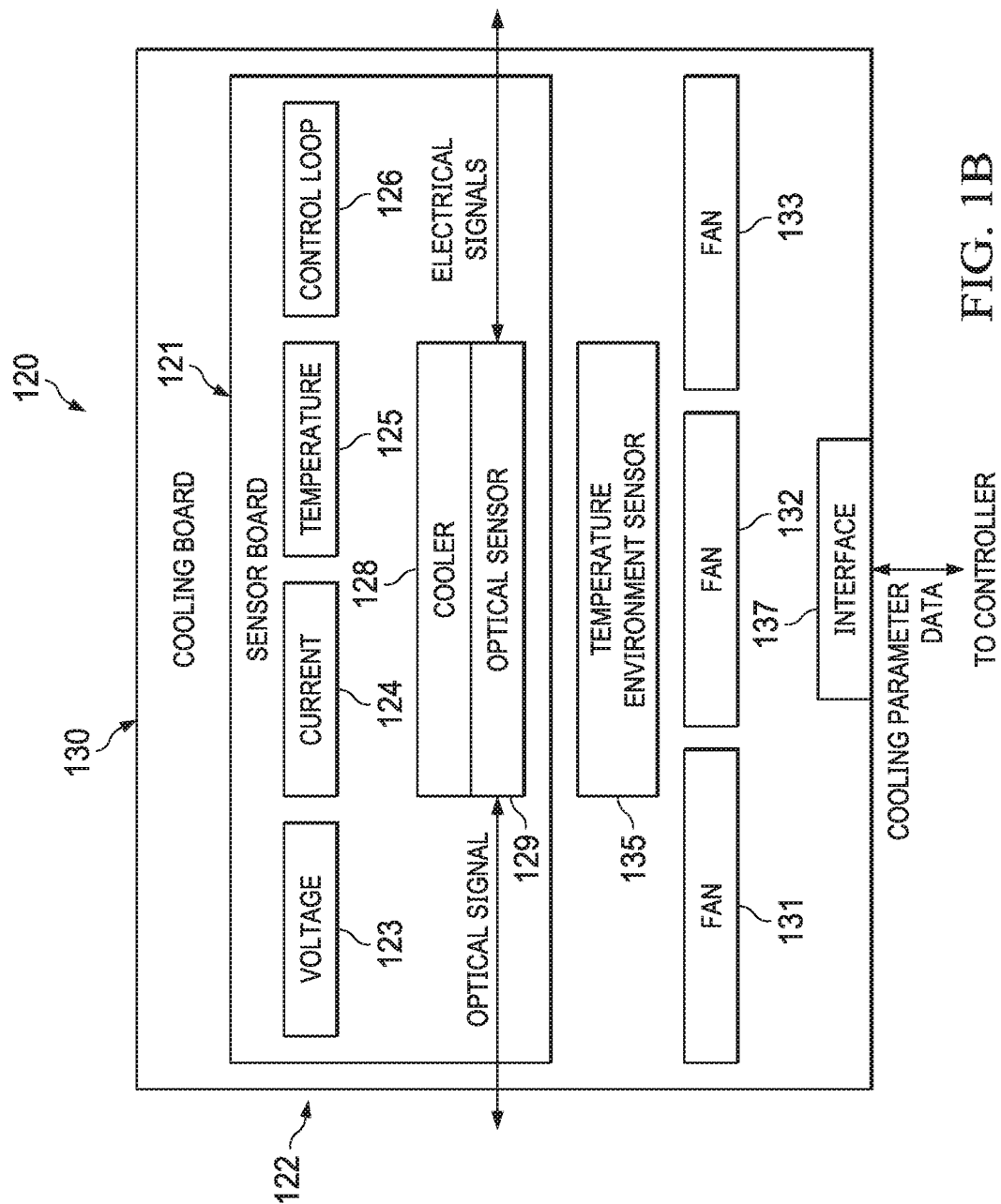
FIG. 1B illustrates a block diagram of an example of an optical sensor with a cooling system constructed according to the principles of the disclosure.

FIG. 1C illustrates a block diagram of an example of a controller 140 of an optical instrument constructed according to the principles of the disclosure. The controller 140 can be, for example, the controller 170 of FIG. 1A, and the optical instrument can be a spectrometer. The controller 140, or at least a portion thereof, can be implemented within a FPGA and/or microcontroller. The controller 140 can be a distributed controller. In some example, the logic of the controller is distributed to different devices, such as a FPGA, a microcontroller, or a combination of such computing devices. In some applications, a portion of the logic can be distributed to a controller of the cooling system, such as on the cooling board 130. The controller 140 includes a thermal monitor 142, a state machine 144, a communications interface 146, and a mode selector 148.

The thermal monitor 142 is configured to determine possible data corruption from an optical sensor. In one example, the thermal monitor 142 receives cooling parameters from a cooling system of the optical sensor and based thereon, determines the possible data corruption. From the cooling parameters, the thermal monitor 142 can determine when an optical sensor is close to a condition that could give compromised data. The thermal monitor 142 can employ the cooling parameters individually or collectively to determine if the cooling system is sufficiently cooling the optical sensor to prevent data corruption. The thermal monitor 142 can compare individual cooling parameters to operating limits to indicate potential problems. For example, an operating temperature of a cooler can be compared to a temperature threshold for the cooler that is a predetermined number of degrees below the temperature operating limit based upon the dynamics of the temperature control loop. The control loop can be a proportional integral differential (PID) control loop. Thus, the thermal monitor 142 can determine the possibility of a potential problem that could corrupt the data from an optical sensor. The thermal monitor 142 can also weight some or all of the cooling parameters and determine possible data corruption therefrom. For example, the temperature of the cooler can be given one weight, fan speed can be given another weight, and the temperature of the environment can be given yet another weight. These weighted cooling parameters can then be added to create a score that is compared to predetermined value to determine if the optical sensor is close to a condition that could give compromised data. The thermal monitor 142 can also monitor an error voltage of the feedback control loop of the cooler to indicate when close to a compromised data condition. A set point can be established to indicate proximity to a compromised data condition. The set point can be established based on a known maximum error voltage and historical data. The thermal monitor 142 can provide feedback via a system output to indicate proximity to compromised data conditions. The feedback can be provided to a display for a visual warning or a software indication can be provided to control software. The type of feedback can vary depending on the cooling parameters. For example, if multiple temperature sensors indicate a high temperature, multiple fans are out of service, or the control loop is saturated, the feedback can indicate an imminent condition requiring action as soon as possible. With such a problem, another monitoring process could be prevented from starting until the system is examined.

The state machine 144 controls the operation of an optical sensor and the conversion system of the optical instrument. A synch signal is used to initiate the state machine. The synch signal can be an external synch signal or an internal synch signal. The communications interface 146 can receive the external synch signal. The communications interface 146 can receive the external synch signal from directly from the modulation system of the optical source or from an optical sensor that determines the external synch signal from monitoring the optical source when being modulated by the modulation system. When using the external synch signal, the controller 140 is in synch mode. The mode selector 148 can receive an input indicating synch mode. In one example, a user or external controller such as a processing tool can provide the synch mode signal. In another embodiment, the controller 140 can automatically enter synch mode when receiving the external synch signal. In synch mode, the optical sensor timing and the conversion system timing are acting as slaves to the external synch signal.

In addition to control commands from the state machine, the controller 140 can also send shutter commands to the optical sensor when in synch mode. This provides an electronic shutter system that allows very short integration times (milliseconds to microseconds) to by synchronously collected over multiple cycles until the charge level was adequate to be read.

Figure 2:
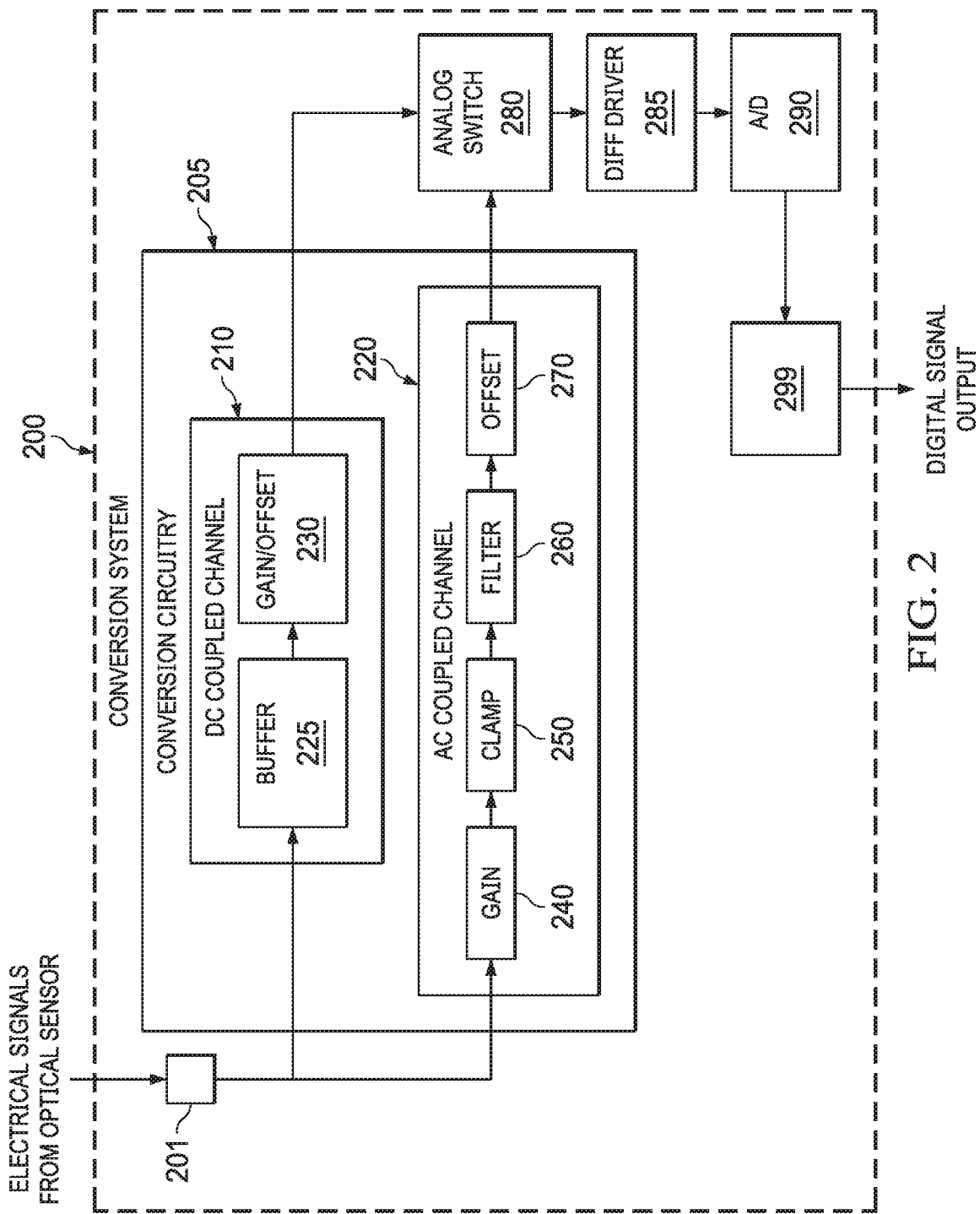
FIG. 2 is block diagram of details of a conversion system for an optical sensor, in accordance with the principles of the disclosure.

Maximizing the dynamic range, signal-to-noise ratio, data rates and other characteristics are important improvements for the utility of an optical instrument, such as optical instrument 150. To address the limitations of conventional optical instruments such as spectrometers and integrated optical sensors, in light of limitations from specific circuit elements including digitizers, a new configuration for signal conversion is required. To that end, FIG. 2 illustrates a block diagram of details of an improved conversion system, conversion system 200 constructed according to the principals of the disclosure.

The conversion system 200 processes electrical signals from an optical sensor and provide a combination of wide dynamic range, high signal-to-noise ratio and high speed operation. Conversion system 200 includes a single processing or conversion path having parallel signal channels that advantageously provide extended functionality for signal analog-to-digital conversion for signal voltages from optical sensors. The conversion system 200 includes an input interface 201, conversion circuitry 205 having two parallel signal channels 210 and 220, and an output interface 299.

Signal channel 210 may be a DC coupled channel and include buffer stage 225 and gain/offset stage 230. An electrical signal from an optical sensor, such as shown in FIG. 3B, may be directed to DC coupled channel 210 where it first enters buffer stage 225. Buffer stage 225 may include an NPN transistor or other circuit elements configured as an emitter-follower for current amplification and input/output resistance conversion. After impedance buffering at the buffer stage 225, the electrical signal passes to a combined gain/offset stage 230 where the signal may be amplified and otherwise adjusted to best be accommodated at subsequent A/D convertor 290. Gain/offset stage 230 may be affected by the use of an operational amplifier or discrete components configured with adjustable offset and gain.

Signal channel 220 may be an AC coupled channel configured for a DC restoration technique and include gain stage 240, clamp stage 250, filter stage 260 and offset stage 270. Gain stage 240 may be effected by the use of an operational amplifier configured with adjustable gain. Clamp stage 250 may include a switch element and receiving a "clamp" signal to set a reference signal level at a certain time during the waveform of the optical sensor signal. Filter stage 260 is an active low pass filter to prevent waveform aliasing when digitized. A subsequent offset stage 270 may be affected by the use of an amplifier with adjustable offset.

The outputs from the parallel signal channels 210 and 220 may be directed to analog switch 280 for selection. As illustrated in FIG. 2, the analog switch 280 is advantageously positioned in series after the parallel signal channels 210, 220 wherein the electrical signals are provided to both signal channels 210, 220, but only one of the modified electrical signals is selected. Subsequently, a selected signal is received and processed by differential driver 285 and then received by analog to digital convertor 290 for conversion to a digital signal. The digital signal output can be amplified. Analog switch 280 may be, for example, similar to ADG1419 provided by Analog Devices. Differential driver 285 may be, for example, similar to ADA4922 provided by Analog Devices.

Certain advantages of conversion system 200 may be summarized as follows. Signal channel 210 provides a fully differential DC signal path with a very limited number of circuit elements. This provides an overall low noise signal path and removes certain noise and signal offset sources that can arise from the DC restoration occurring on signal channel 220. This signal channel is used advantageously for optical sensors having a slower clock speed, such as CCD's with slower clock speeds, and each "sample" includes an associated pair of measurements of the reference and data portions of the signal. Signal channel 220 although having a noise and offset signature greater than signal channel 210 may be operated much faster, for example two to ten times faster, as signal channel 210 since the clamp stage 250 negates the need for the independent measurement of the reference signal level. Simply stated signal channel 210 is for low noise and signal channel 220 is for high speed operation.

The configuration of certain inverting and non-inverting geometries is convenient since the output from optical sensors such as a CCD is commonly inverted and negative going and the multiple stages of the two signal channels 210 and 220 should, most conveniently, be at the same polarity at the switch 280, driver 285, and the digitizer 290. The use of common differential driver 285 and digital convertor 290 for each of the parallel signal channels of the conversion circuitry 205 further reduces circuit complexity and cost. By control of digital convertor 290 in coordination with clocking of the optical sensor, oversampling may be done for either signal channel 210 and 220 further decreasing noise at the cost of overall data rate.

Sample timing, clamp signaling, channel switching and digitizer control, and other low-level functions of conversion system 200 as well as other functions of an associated optical sensor and optical instrument may be controlled by elements such as controller 170 of FIG. 1A. The selection of signal channels can be based on an operating mode of an optical system associated with the conversion system 200. The selection or setting can be done before the operation or process that is being monitored is started. A process engineer, for example, can determine the best signal channel to employ for the conversion system 200 based on an analysis of the operation or type of process being monitored in a process chamber. When processes or operations change, the selection of signal channel can also change. In some embodiments, the selection can be performed automatically by a controller.

Figure 3A:
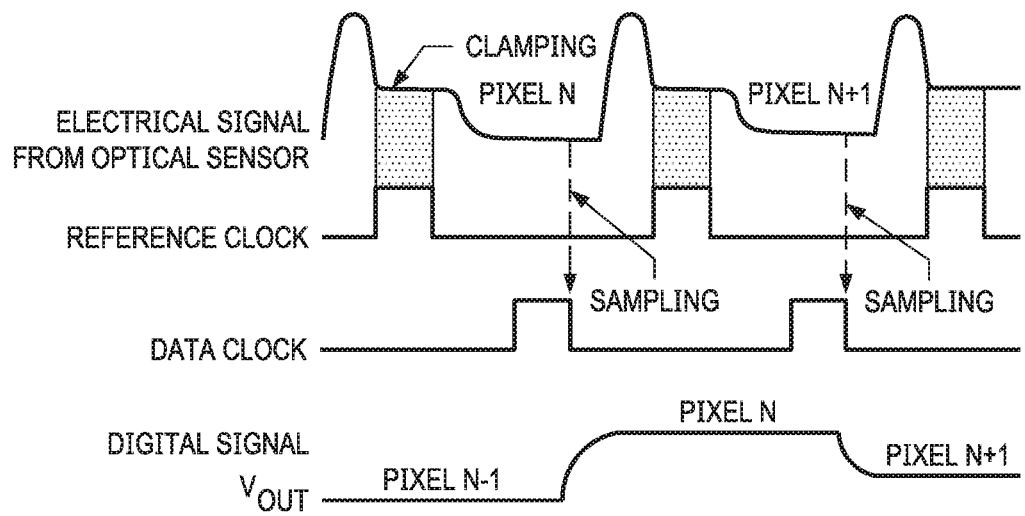
FIGS. 3A and 3B are a simplified time-series representations of signals from optical sensors and related sampling provided by a conversion system, in accordance with the principles of the disclosure.
Figure 3B:
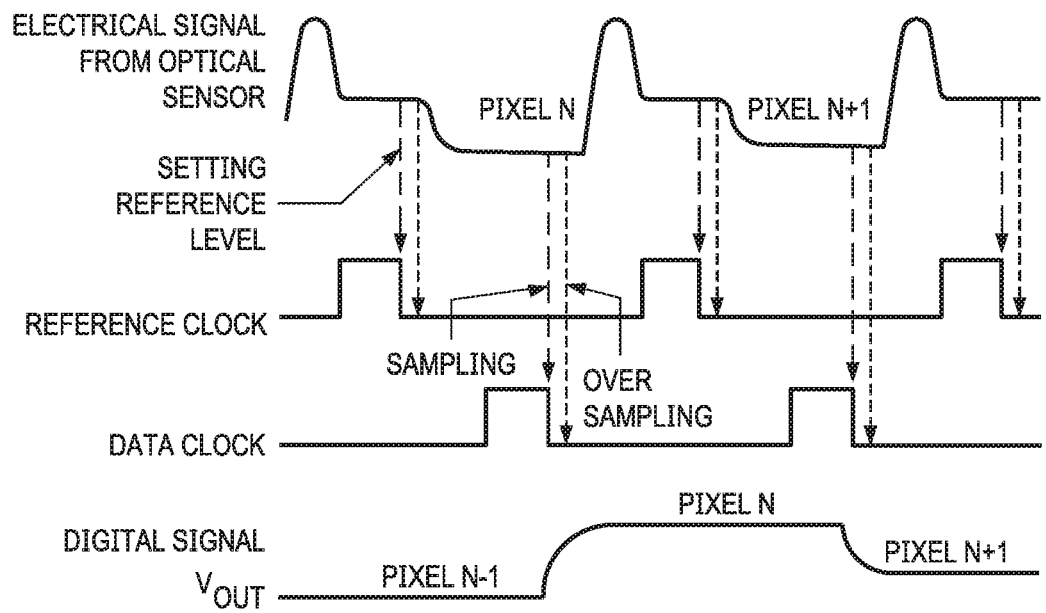

FIGS. 3A and 3B are a simplified time-series representations of electrical signals from an optical sensor, such as a CCD, showing the coordination of sampling, clamping and digitization for the various signal channels of a conversion system. The time-series representations can be driven by state machines, such as state machine 144 of FIG. 1C. An external or internal synch signal can be used. FIG. 3A specifically relates to signal channel 220, where a reference clamp signal, timed according to a reference clock signal that changes the state of the clamp switch, e.g., clamp 250, to set the reference signal level followed by the actual sampling and digitization of the data portion of the electrical signal according to a data clock signal.

FIG. 3B specifically relates to signal channel 210, where a reference signal level is sampled and digitized according to a reference clock signal followed by the sampling and digitization of the data signal level according to a data clock signal. For both signal channels 210 and 220 multiple sampling may be performed at the appropriate times (as indicated by the multiple arrows in FIG. 3B) to permit signal averaging after digitization. It should be understood that ultimate clock speeds for sampling and digitization may be set by limitations in the optical sensor or in the digitizer. The reference clock signal and the data clock signal for both FIGS. 3A and 3B can be from a controller, such as the controller 170. In FIGS. 3A and 3B sampling is done on the falling edge of the data clock with additional sampling shown in FIG. 3B controlled by another clock not shown. Sampling can also be performed on leading edges of data clocks.

The resulting output for both FIG. 3A and FIG. 3B is a digital signal, such as the digital output from A/D converter 290. The digital signal output represents voltage values for pixels of the optical sensor. For example, the digital signal output can be from zero to $2^{18}$ to represent a voltage value within a range of zero to five volts.

Figure 4:
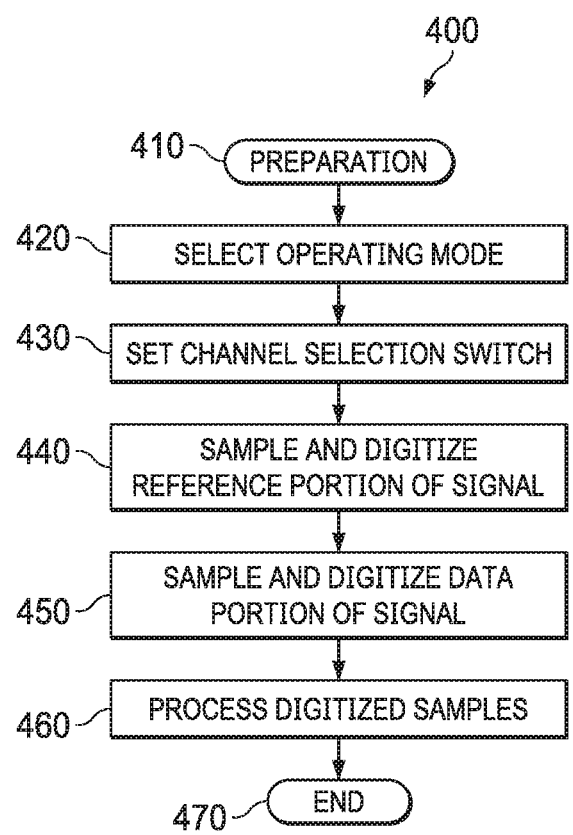
FIG. 4 is a flow chart for a method of processing optical data from an optical sensor, in accordance with the principles of the disclosure.

FIG. 4 is a flow chart for an example of a process 400 of converting optical signal data from an optical sensor. Process 400 initiates with preparation step 410 wherein any initial parameters may be predetermined. Next in step 420 a selection may be made of a predetermined operating mode of the conversion system, and associated optical instrument and the optical sensor. An operating mode may include, for example, settings and parameters for converting circuit selection, oversample counts and timing, optical signal integration times, digitization schemes for maximizing dynamic range, synch mode, etc. The operating mode can be selected by an operator of the optical instrument. An operating mode may be defined within an external system and conveyed to required components for example by controller 170 of FIG. 1A. For example, an external controller of a process, such as a tool controller or chamber controller, can provide the operating mode. The operating mode can be based on the type of process. The operating mode, in some embodiments, can be provided automatically. For example, the external controller can send the operating mode to a controller of the optical instrument without prompting by a user, such as an engineer or technician. The operating mode can be received by a controller of the optical instrument wherein the controller is configured to direct operation of the optical instrument based on the received operating mode.

Next in step 430 the channel selection switch may be set to select either of the signal channels discussed in FIG. 2. The selection can be based on the received operating mode. A controller of an optical instrument can direct operation of the channel selection switch. In step 440 the reference portion of the signal may be sampled and digitized one or more times. This step generally applies only to signal channel 210 of FIG. 2 but may be applied to signal channel 220 if alternate topologies are used. In step 450 the data portion of the signal may be sampled and digitized one or more times. This step generally applies to both signal channels 210 and 220 of FIG. 2.

Next in step 460, the digitized samples may be processed in accord with the operating modes defined in steps 410 and 420. In general differences between digitized reference and data signal values may be computed and where oversampling has been performed averaging may also be performed prior to determination of signal value differences. Process 400 ends with a step 470 wherein computed values may be stored and/or conveyed to other connected systems for further use.

Changes may be made in the signal conversion systems and subsystems described herein without departing from the scope hereof. For example, although certain examples are described in association with spectrometers and semiconductor wafer processing equipment, it may be understood that the signal conversion systems described herein may be used with other types of optical instruments such as cameras for spatial imaging, interferometers, photometers, polarimetric sensors, and for general purpose light measurement.

The embodiments described herein were selected in order to best explain the principles of the disclosure and the practical application, and to enable others of ordinary skill in the art to understand the disclosure for various embodiments with various modifications as are suited to the particular use contemplated. The particular embodiments described herein are in no way intended to limit the scope of the present disclosure as it may be practiced in a variety of variations and environments without departing from the scope and intent of the disclosure. Thus, the present disclosure is not intended to be limited to the embodiments shown, but is to be accorded the widest scope consistent with the principles and features described herein.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

As will be appreciated by one of skill in the art, the disclosure or parts thereof may be embodied as a method, system, or computer program product. Accordingly, the features disclosed herein, or at least some of the features, may take the form of an entirely hardware embodiment, an entirely software embodiment (including firmware, resident software, micro-code, etc.) or an embodiment combining software and hardware aspects all generally referred to herein as a "circuit" or "module." Some of the disclosed features may be embodied in or performed by various processors, such as digital data processors or computers, wherein the computers are programmed or store executable programs of sequences of software instructions to perform one or more of the steps of the methods. Thus, features or at least some of the features disclosed herein may take the form of a computer program product on a non-transitory computer-usable storage medium having computer-usable program code embodied in the medium. The software instructions of such programs can represent algorithms and be encoded in machine-executable form on non-transitory digital data storage media.

Thus, portions of disclosed examples may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Those skilled in the art to which this application relates will appreciate that other and further additions, deletions, substitutions and modifications may be made to the described embodiments.

Various aspects of the disclosure can be claimed including the apparatuses, systems, and methods disclosed herein. Aspects disclosed herein include:

A. An optical instrument that includes: (1) an optical sensor configured to receive an optical input and convert the optical input to electrical signals, and (2) a conversion system having conversion circuitry having multiple parallel signal channels that are configured to receive and modify the electrical signals to analog outputs, an analog switch configured to select one of the parallel signal channels according to an operating mode of the optical instrument, and an analog to digital converter configured to receive and convert the analog output from the selected parallel signal channel to a digital signal output.

B. A method of converting an optical input to a digital signal output that includes: (1) receiving an operating mode, (2) receiving electrical signals from an optical sensor representing an optical input to the optical sensor, (3) selecting one of at least two parallel signal channels based on the operating mode for modifying the electrical signals, and (4) converting the modified electrical signals to a digital signal output.

C. A spectrometer that includes: (1) a controller configured to direct operation of the spectrometer based on an operating mode, (2) an optical sensor configured to receive an optical input and provide electrical signals based on the optical input and the operating mode, and (3) a conversion system that modifies the electrical signals along parallel signal channels and selects one of the modified electrical signals as a digital signal output based on the operating mode.

Each of aspects A, B, and C can have one or more of the following additional elements in combination:
Element 1: wherein the conversion circuitry, the analog switch, and the analog to digital converter are coupled in series. Element 2: wherein the analog switch is coupled in series between the analog to digital converter and the conversion circuitry. Element 3: further comprising a differential driver configured to receive and modify the selected analog output and provide the selected analog output to the analog to digital converter. Element 4: wherein the optical instrument has a single conversion path between an input and an output of the conversion system. Element 5: wherein the conversion circuitry includes at least two parallel signal channels. Element 6: wherein the at least two parallel signal channels include a DC coupled channel and an AC coupled channel. Element 7: further comprising a controller configured to send shutter commands to the optical sensor for timing the collection of the optical input. Element 8: further comprising a controller configured to direct operation of the analog switch based on the operating mode. Element 9: further comprising a controller configured to synchronize timing, based on the operating mode, for the optical sensor to generate the electrical signals from the optical signals and for the conversion circuitry to receive and modify the electrical signals. Element 10: wherein the timing is based on an external synchronization signal. Element 11: further comprising a controller configured to generate a warning of potential compromised electrical signals from the optical sensor based on at least one cooling parameter received from the optical sensor. Element 12: wherein the at least one cooling parameter is selected from the list consisting of: an operating voltage of a cooler of the optical sensor, an operating current of a cooler of the optical sensor, an operating temperature of a cooler of the optical sensor, operating parameters of at least one fan of a cooling system of the optical sensor, an operating temperature of the optical sensor, and operating feedback from a control loop of a cooler of the optical sensor. Element 13: wherein the converting includes providing differential output signals from the modified electrical signals before the converting to the digital signal output. Element 14: wherein the operating mode indicates a type of synch signal to use for controlling the method. Element 15: further comprising receiving an external synch signal and employing the external synch signal for timing the conversion of the optical input to the electrical signals and for modifying the electrical signals. Element 16: wherein the at least two parallel signal channels is a DC coupled channel and an AC coupled channel. Element 17: further comprising monitoring cooling parameters of the optical sensor and generating a warning that the electrical signals are potentially compromised based on at least one of the cooling parameters. Element 18: wherein the operating mode is received from a processing chamber controller. Element 19: wherein the optical sensor receives shutter commands for timing the collection of the optical input. Element 20: wherein the operating mode indicates which one of the modified electrical signals is selected. Element 21: wherein the operating mode indicates employing either an external synch signal or an internal synch signal for controlling operation of the optical sensor and the conversion system. Element 22: wherein the controller, upon receiving an external synch signal, automatically employs the external synch signal for controlling operation of the optical sensor and the conversion system. Element 23: wherein the controller is further configured to send shutter commands to the optical, sensor and the optical sensor is configured to employ the shutter commands to time the collection of the optical input. Element 24: wherein the optical sensor includes a cooling system, and the controller is further configured to generate a warning indicating the electrical signals are potentially compromised based on monitoring the cooling system. Element 25: wherein the parallel signals channels are two channels, a DC coupled channel and an AC coupled channel. Element 26: wherein the controller is a programmable integrated circuit.

What is claimed is:

1. An optical instrument, comprising:
an optical sensor configured to receive an optical input and convert the optical input to electrical signals; and
a conversion system, including:
an input interface configured to receive the electrical signals from the optical sensor;
conversion circuitry having multiple parallel signal channels that are configured to concurrently receive the electrical signals from the input interface via non-switchable connections and modify the electrical signals to different analog outputs, wherein the multiple parallel signal channels include a DC coupled channel and an AC coupled channel;
an analog switch configured to select one of the multiple parallel signal channels according to an operating mode of the optical instrument; and
an analog to digital converter configured to receive and convert the analog output from the selected one of the multiple parallel signal channels to a digital signal output, wherein the analog switch is positioned in between the selected one of the multiple parallel signal channels of the conversion circuitry and the analog to digital converter.

2. The optical instrument as recited in claim 1 wherein the conversion circuitry, the analog switch, and the analog to digital converter are coupled in series.

3. The optical instrument as recited in claim 1 further comprising a differential driver configured to receive and modify the selected analog output and provide the selected analog output to the analog to digital converter.

4. The optical instrument as recited in claim 1 wherein the optical instrument has a single conversion path between an input and an output of the conversion system.

5. The optical instrument as recited in claim 1 wherein the multiple parallel signal channels are two parallel signal channels that are the DC coupled signal channel and the AC coupled signal channel.

6. The optical instrument as recited in claim 1 further comprising a controller configured to send shutter commands to the optical sensor for timing collection of the optical input.

7. The optical instrument as recited in claim 1 further comprising a controller configured to direct operation of the analog switch based on the operating mode.

8. The optical instrument as recited in claim 1 further comprising a controller configured to synchronize timing, based on the operating mode, for the optical sensor to generate the electrical signals from the optical input and for the conversion circuitry to receive and provide the different analog outputs by modifying the electrical signals.

9. The optical instrument as recited in claim 8 wherein the timing is based on an external synchronization signal.

10. The optical instrument as recited in claim 1 further comprising a controller configured to generate a warning of potential compromised electrical signals from the optical sensor based on at least one cooling parameter received from the optical sensor.

11. The optical instrument as recited in claim 10 wherein the at least one cooling parameter is selected from the list consisting of:
an operating voltage of a cooler of the optical sensor,
an operating current of a cooler of the optical sensor,
an operating temperature of a cooler of the optical sensor, operating parameters of at least one fan of a cooling system of the optical sensor,
an operating temperature of the optical sensor, and
operating feedback from a control loop of a cooler of the optical sensor.

12. A method of converting an optical input to a digital signal output, comprising:
receiving an operating mode;
receiving from an optical sensor and at multiple parallel signal channels, electrical signals representing an optical input to the optical sensor, wherein the multiple parallel signal channels concurrently receive the electric signals via non-switchable connections and the multiple parallel signal channels include a DC coupled channel and an AC coupled channel;
providing different analog outputs by modifying the electrical signals according to each of the multiple parallel signal channels;
selecting one of the different analog outputs from the multiple parallel signal channels based on the operating mode; and
converting the selected one of the different analog outputs to a digital signal output.

13. The method as recited in claim 12 wherein the converting includes providing differential output signals from each of the multiple parallel signal channels before the converting to the digital signal output.

14. The method as recited in claim 12 wherein the operating mode indicates a type of synch signal to use for controlling the method.

15. The method as recited in claim 12 further comprising receiving an external synch signal and employing the external synch signal for timing conversion of the optical input to the electrical signals and for modifying the electrical signals.

16. The method as recited in claim 12 further comprising monitoring cooling parameters of the optical sensor and generating a warning that the electrical signals are potentially compromised based on at least one of the cooling parameters.

17. The method as recited in claim 12 wherein the operating mode is received from a processing chamber controller.

18. The method as recited in claim 12 wherein the optical sensor receives shutter commands for timing collection of the optical input.

19. A spectrometer, comprising:
a controller configured to direct operation of the spectrometer based on an operating mode;
an optical sensor configured to receive an optical input and provide electrical signals based on the optical input and the operating mode; and
a conversion system that modifies the electrical signals along parallel signal channels to provide different analog electrical signals according to each one of the parallel signal channels, and selects one of the different analog electrical signals to convert to a digital signal output based on the operating mode, wherein the parallel signals channels include a DC coupled channel and an AC coupled channel and the parallel signal channels concurrently receive the electrical signals via non-switchable connections.

20. The spectrometer as recited in claim 19 wherein the operating mode indicates which one of the different analog electrical signals is selected.

21. The spectrometer as recited in claim 19 wherein the operating mode indicates employing either an external synch signal or an internal synch signal for controlling operation of the optical sensor and the conversion system.

22. The spectrometer as recited in claim 19 wherein the controller, upon receiving an external synch signal, automatically employs the external synch signal for controlling operation of the optical sensor and the conversion system.

23. The spectrometer as recited in claim 19 wherein the controller is further configured to send shutter commands to the optical sensor and the optical sensor is configured to employ the shutter commands to time collection of the optical input.

24. The spectrometer as recited in claim 19 wherein the optical sensor includes a cooling system, and the controller is further configured to generate a warning indicating the electrical signals are potentially compromised based on monitoring the cooling system.

25. The spectrometer as recited in claim 19 wherein the parallel signals channels are two channels, which are the DC coupled channel and the AC coupled channel.

26. The spectrometer as recited in claim 19 wherein the controller is a programmable integrated circuit.

27. The optical instrument as recited in claim 1, wherein the AC coupled channel is configured for a DC restoration technique.

28. The optical instrument as recited in claim 27, wherein the AC coupled channel includes multiple stages connected in series that includes a gain stage that receives the electrical signals, a clamp stage coupled to the gain stage, a filter stage coupled to the clamp stage, and an offset stage that is coupled between the filter stage and the analog switch.

29. The optical instrument as recited in claim 28, wherein the AC coupled channel operates at a clock speed that is at least twice as fast as a clock speed of the DC coupled channel.

* * * * *